United States Patent
Krueger et al.

(10) Patent No.: US 10,740,709 B2
(45) Date of Patent: Aug. 11, 2020

(54) FEATURE BUNDLES IN MULTISTAGE CONFIGURATION TREES

(71) Applicant: BigLever Software, Inc., Austin, TX (US)

(72) Inventors: Charles W. Krueger, Austin, TX (US); Drew Stovall, Austin, TX (US)

(73) Assignee: BIGLEVER SOFTWARE, INC., Austin, TX (US)

( * ) Notice: Subject to any disclaimer, the term of this patent is extended or adjusted under 35 U.S.C. 154(b) by 877 days.

(21) Appl. No.: 14/852,121

(22) Filed: Sep. 11, 2015

(65) Prior Publication Data

US 2016/0078384 A1 Mar. 17, 2016

Related U.S. Application Data

(60) Provisional application No. 62/049,010, filed on Sep. 11, 2014.

(51) Int. Cl.
*G06F 30/00* (2020.01)
*G06Q 10/06* (2012.01)
*G06F 8/20* (2018.01)

(52) U.S. Cl.
CPC ....... *G06Q 10/06315* (2013.01); *G06F 30/00* (2020.01); *G06F 8/20* (2013.01)

(58) Field of Classification Search
None
See application file for complete search history.

(56) References Cited

U.S. PATENT DOCUMENTS

| 2005/0216879 A1* | 9/2005 | Ruhe | G06Q 10/10 717/101 |
| 2009/0089738 A1* | 4/2009 | Krueger | G06F 8/61 717/104 |
| 2014/0180881 A1 | 6/2014 | Krueger et al. | |

OTHER PUBLICATIONS

Czarnecki K, Helsen S, Eisenecker U. 2004. Staged configuration using feature models. In Software Product Lines: Third International Conference, SPLC 2004, Boston, MA, USA, Aug. 30-Sep. 2, 2004. Proceedings, vol. 3154 of Lecture Notes in Computer Science. NordRL (ed). Springer-Verlag: Heidelberg, Germany.*

* cited by examiner

*Primary Examiner* — Richard N Scheunemann
(74) *Attorney, Agent, or Firm* — DuBois, Bryant & Campbell, LLP; William D. Wiese (57) ABSTRACT

A product line engineering (PLE) multistage configuration tree that supports the engineering, deployment and maintenance of complex product family trees is provided. Feature bundles which combine a group of feature decisions into a single bundled offering are inherited by the children of the node in the product family tree where they are defined. The children see only the smaller collection of bundled offerings rather than all the possible combinations of the multiple feature offerings that are encapsulated by the feature bundle.

6 Claims, 6 Drawing Sheets

FEATURE BUNDLES IN MULTISTAGE CONFIGURATION TREES

PRIORITY STATEMENT UNDER 35 U.S.C. § 119

This application claims priority under 35 U.S.C. § 119 based upon prior U.S. Provisional Patent Application Ser. No. 62/049,010, filed Sep. 11, 2014, in the name of Charles W. Kreuger and Drew Stovall entitled "Feature Bundles in Multistage Configuration Trees," the disclosure of which is incorporated herein in its entirety by this reference.

BACKGROUND OF THE INVENTION

The present invention pertains to the creation of a software representation of feature bundles in multistage configuration trees to provide product option codes; more particularly, the present invention pertains to the creation of a software representation of product option codes for a family of similar products or systems, based on the extension of feature bundles in multistage configuration trees and the underlying primitive feature models.

In successful commercial product line organizations, the number and diversity of products deployed can grow to be extremely large, partially due to the efficiencies made available from systems and software product line engineering (PLE) tools and methods. In market segments such as automobiles, it is not unusual for companies to manufacture millions of product instances every year, in thousands of different "flavors".

Product option codes, or product configuration codes, are used by these companies to express the manufacturable or salable options that can be selected and combined when producing a particular product or system "flavor". A particular product or system that is being manufactured or sold can be described in terms of the choices for all of the available product option codes.

During the engineering and manufacturing of a product family, its product option codes are often used to create the mapping from an option selection to determine the mechanical, electrical and software parts needed to realize the option. For product lines such as automobiles, this requires engineers to create mappings from product option codes to thousands of parts. Any error in these mappings can result in defective products, product recalls, manufacturing line disruptions, and more.

Further exacerbating this expense and risk, product option codes for one family can be slightly different from another family. For example, a "sport package" option for a pickup truck family may be different from the "sport package" for a luxury sedan family. The requires each product family to have its own set of product option codes and the full set of expensive and error prone mapping from hundreds of product option codes to thousands of mechanical, electrical and software parts. This mapping may need to be repeated dozens or hundreds of times per year in companies such as automotive manufacturers.

Even small improvements in creating and managing product option codes can provide dramatic economic and efficiency benefits.

SUMMARY OF THE INVENTION

The present invention serves to dramatically simplify and automate the creation of product option codes, based on multistage configuration trees in product line engineering (PLE), extended with ability to create feature bundles. Rather than repeatedly creating a complete mapping from product option codes directly to mechanical, electrical and software parts, the invention splits the mapping into two mappings, one that is difficult and done once plus one that is easy and repeated to get the product option codes:

(1) Multistage configuration trees provide an effective way of representing the mapping from product "feature" options to mechanical, electrical and software parts. This mapping is created once and then shared across all of the product families represented in the a multistage configuration tree.

(2) The unique product option codes that are needed for each product family can then be expressed as a mapping to feature bundles in a multistage configuration tree. This unique mapping on top of a multistage configuration tree requires a small fraction of the effort compared to the full mapping to mechanical, electrical and software parts.

The majority of the mapping effort goes into the single mapping from multistage configuration trees to mechanical, electrical and software parts (the first bullet), which is reused as-is in the much smaller repeated effort to define the product option codes for each of the product families.

The invention offers a dramatic reduction in the cost, time, effort, and errors associated with creating and managing product option codes and the mappings to mechanical, electrical and software part selections based on those product option codes. The reduction in overall effort could be as high as 99% across a large product line such as in automotive manufacturing.

The foregoing has outlined rather broadly certain aspects of the present invention in order that the detailed description of the invention that follows may better be understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

The present invention pertains to the creation of a software representation of feature bundles in multistage configuration trees to provide product option codes; more particularly, the present invention pertains to. The present invention is directed to improved methods and systems for, among other things, the creation of a software representation of product option codes for a family of similar products or systems, based on the extension of feature bundles in multistage configuration trees and the underlying primitive feature models. The configuration and use of the presently preferred embodiments are discussed in detail below. It should be appreciated, however, that the present invention provides many applicable inventive concepts that can be embodied in a wide variety of contexts other than the extension of feature bundles in multistage configuration trees. Accordingly, the specific embodiments discussed are merely illustrative of specific ways to make and use the invention, and do not limit the scope of the invention.

Feature bundles provide an innovative means for clearly identifying a limited set of desirable feature combinations in multistage configuration trees. As described in U.S. Patent Publication Number US 2014/0180881, multistage configuration trees are used to manage product family trees in systems and software product line engineering (PLE). The objectives and benefits of feature bundles include:

Simplifying and reducing the effort required to create product option codes and the mappings from product option codes to mechanical, electrical and software part selections; and Reducing the number of available combinations and the complexity of managing the product variants offered in a product family tree.

Although selection, downselection, and inheritance in multistage configuration trees provide a means for reducing the combinatoric complexity of product variants, product line engineering organizations with complex products may still be confronted with more product configurations than the number of atoms in the known universe (estimated to be $10^{80}$), at the leaves of their multistage configuration trees. Feature bundles provide further means of dramatically reducing the combinatoric complexity to manageable and desirable levels of product offerings in their product line portfolio.

Feature bundles are applied to nodes in a multistage configuration tree. As the name suggests, feature bundles take a group of feature decisions and combine them into a single bundled offering. Feature bundles are inherited by the children of the node in the tree where they are defined. The children see only the smaller collection of bundled offerings, in place of all the possible combinations of the multiple feature offerings that are encapsulated by the bundle.

Figure 1:
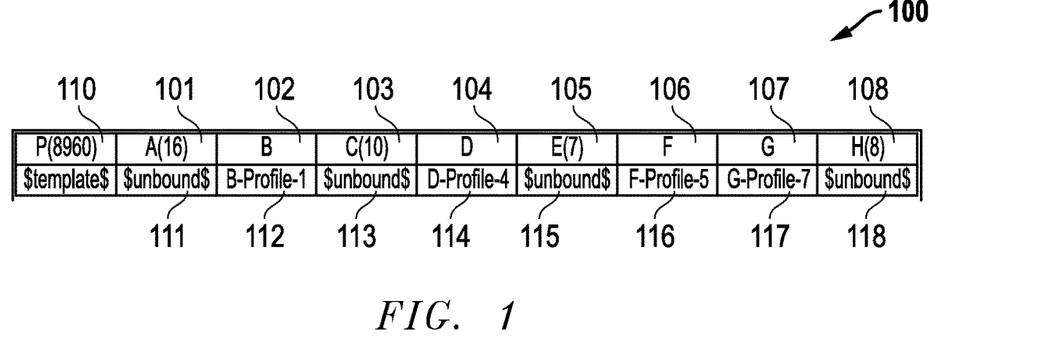
FIG. 1 is a depiction of a node P containing 8 features in a multistage configuration tree.

Referring now to FIG. 1 which shows a node 100 named P in a multistage configuration tree. The node 100 contains 8 features, identified by columns A through H. Some of the features already have their feature decisions bound at the node:

Feature B 102 has selection B-Profile-1 112
Feature D 104 has selection D-Profile-4 114
Feature F 106 has selection F-Profile-5 116
Feature G 107 has selection G-Profile-7 117

Some of the features have unbound selections. The numbers in parenthesis in unbound columns identify how many possible selections are available for each feature.

Feature A 101 has 16 possible selections
Feature C 103 has 10 possible selections
Feature E 105 has 7 possible selections
Feature H 108 has 8 possible selections Based on the multiplicative combination of these unbound features (16×10×7×8), node P has 8960 possible feature configurations, as shown in the parenthesis next to its name.

Figure 2:
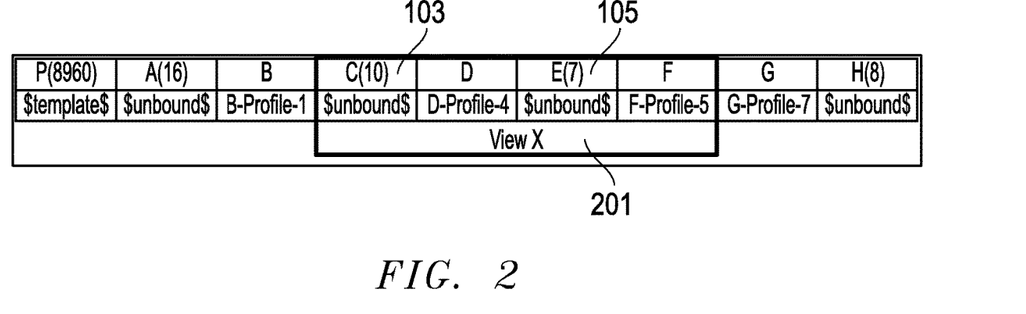
FIG. 2 is a depiction of the node P of FIG. 1 in which a subset X is designated.

FIG. 2 shows a view named X applied to the node. A view comprises a subset of the available features, comprising one or more of the available features in the node. Although the features in the view in FIG. 2 through FIG. 7 are shown as adjacent for simplicity, features in a view do not need to be adjacent. Note that the number of possible feature configurations for the view is the multiplicative combination of the unbound features in that view, which is 10 for feature C 103 times 7 for feature E 105, or 70 total possible combinations. The combinatoric complexity for features in a view is exponential in the number of unbound features.

Figure 3:
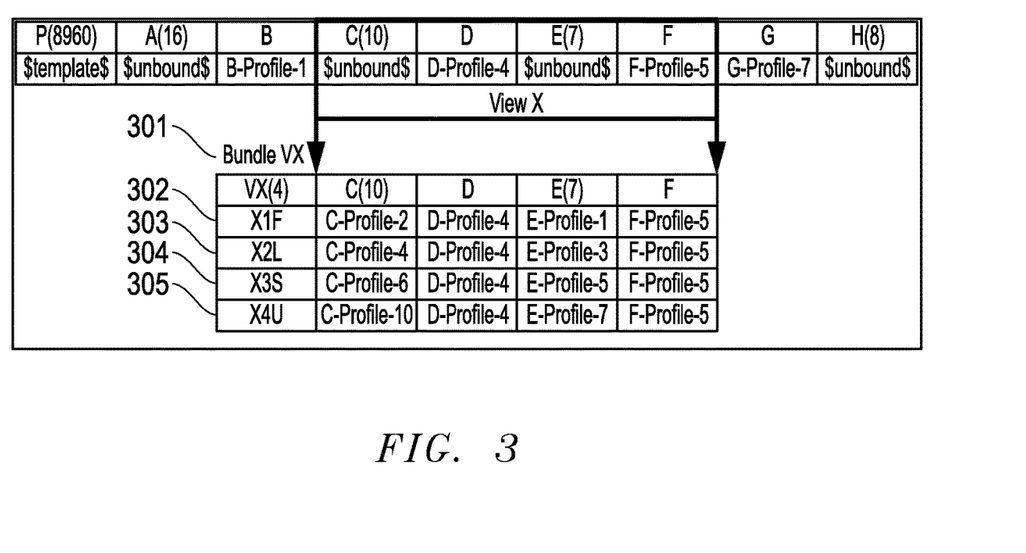
FIG. 3 is a depiction of the node P of FIG. 2 in which a feature bundle VX is designated.

FIG. 3 illustrates a feature bundle 301 named VX, created from view X 201. The bundle 301 contains the same features as the view X (i.e. feature C 103, feature D 104, feature E 105 and feature F 106), plus a list of bundle profiles, one for each desired bundle of feature configurations, illustrated as rows. Each bundle profile has a name to identify the profile. The names of the four bundle profiles in FIG. 3 are X1F 302, X2L 303, X3S 304 and X4U 305.

A bundle constrains the possible feature configurations of the view to only those listed as bundle profiles. With feature bundle VX, there are only 4 possible feature configurations, compared to the original 70 possible configurations in view X. Feature bundles reduce the complexity from exponential in the view to linear in the bundle by explicitly enumerating the list of possible feature configurations that are desired for the view.

Figure 4:
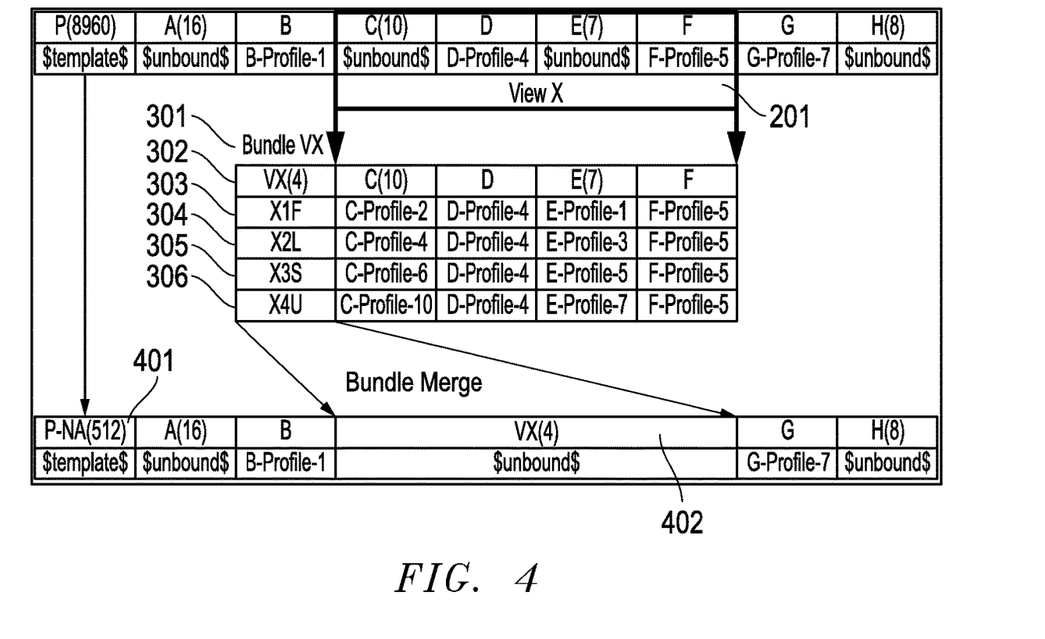
FIG. 4 is a depiction of the node of FIG. 3 in which the feature bundle VX is inherited by node P-NA which contains an unbound feature bundle VX.

FIG. 4 shows how a feature bundle is inherited by children of a node in a multistage configuration tree. The children see the merged view of the feature bundle in place of the multiple features that are in the parent bundle view. Node P-NA 401 at the bottom of the illustration contains an unbound feature bundle VX 402, with four possible selections, X1F 302, X2L 303, X3S 304 and X4U 305. Note that the number of feature combinations for node P-NA 401 is now 512, compared to 8960 for the parent node P 100, for a 94% reduction in combinatoric complexity.

Figure 5:
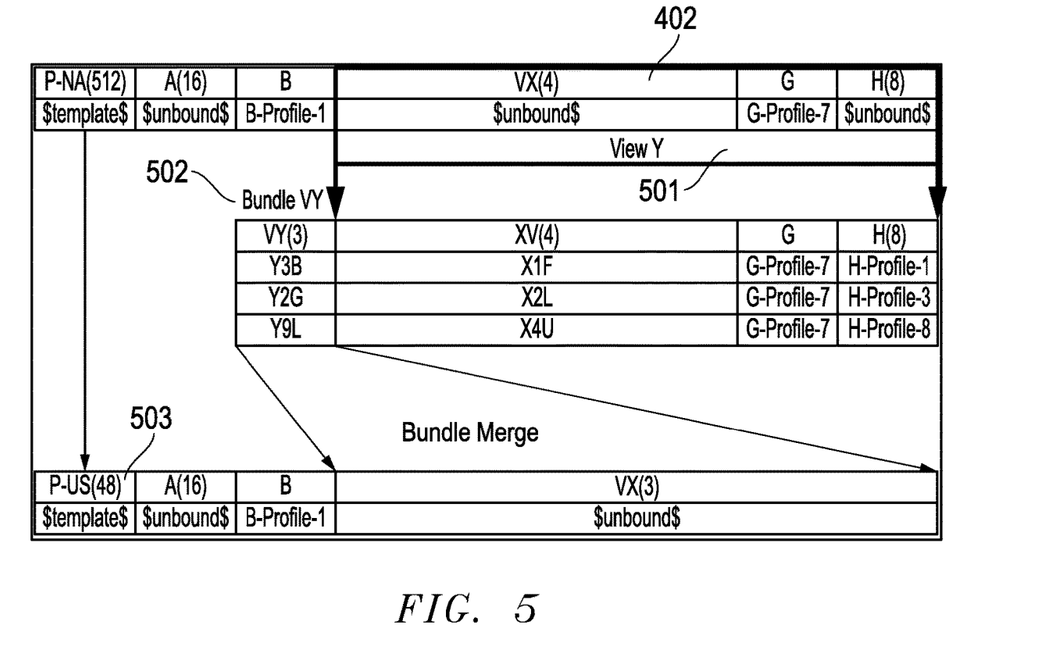
FIG. 5 is a depiction of the node of FIG. 3 in which the feature bundle VX is inherited by node P-NA which contains an unbound feature bundle VY.

FIG. 5 shows that feature bundles can be applied recursively. View Y 501 contains feature bundle VX 402, which is now used to create feature bundle VY 201. This bundle further reduces the combinatoric complexity of 512 in node P-NA 401 to 48 in child node P-US 503.

Figure 6:
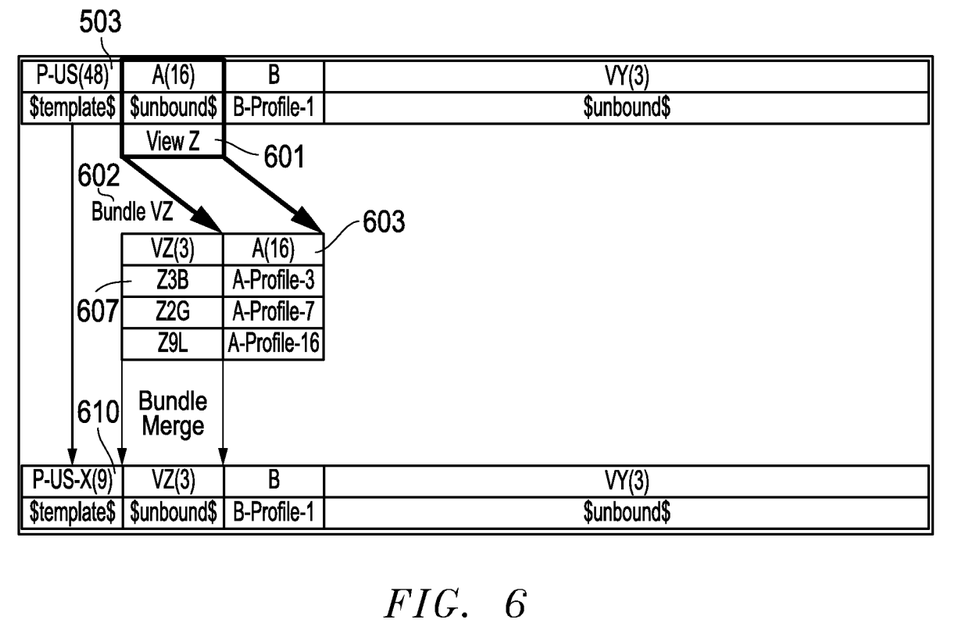
FIG. 6 is a depiction of node P-US in which a feature bundle VZ contains only a single feature.

FIG. 6 illustrates a feature bundle VZ 602 applied from View Z 601, which contains only a single feature A 603. This technique is useful for aliasing feature selection names at the parent node to match desired feature selection names at the child node. For example, feature A 603 profile selection A-Profile-3 604 in parent node P-US 503 is aliased to feature bundle VZ 602 profile selection Z3B 607 in child node P-US-X 610.

Figure 7:
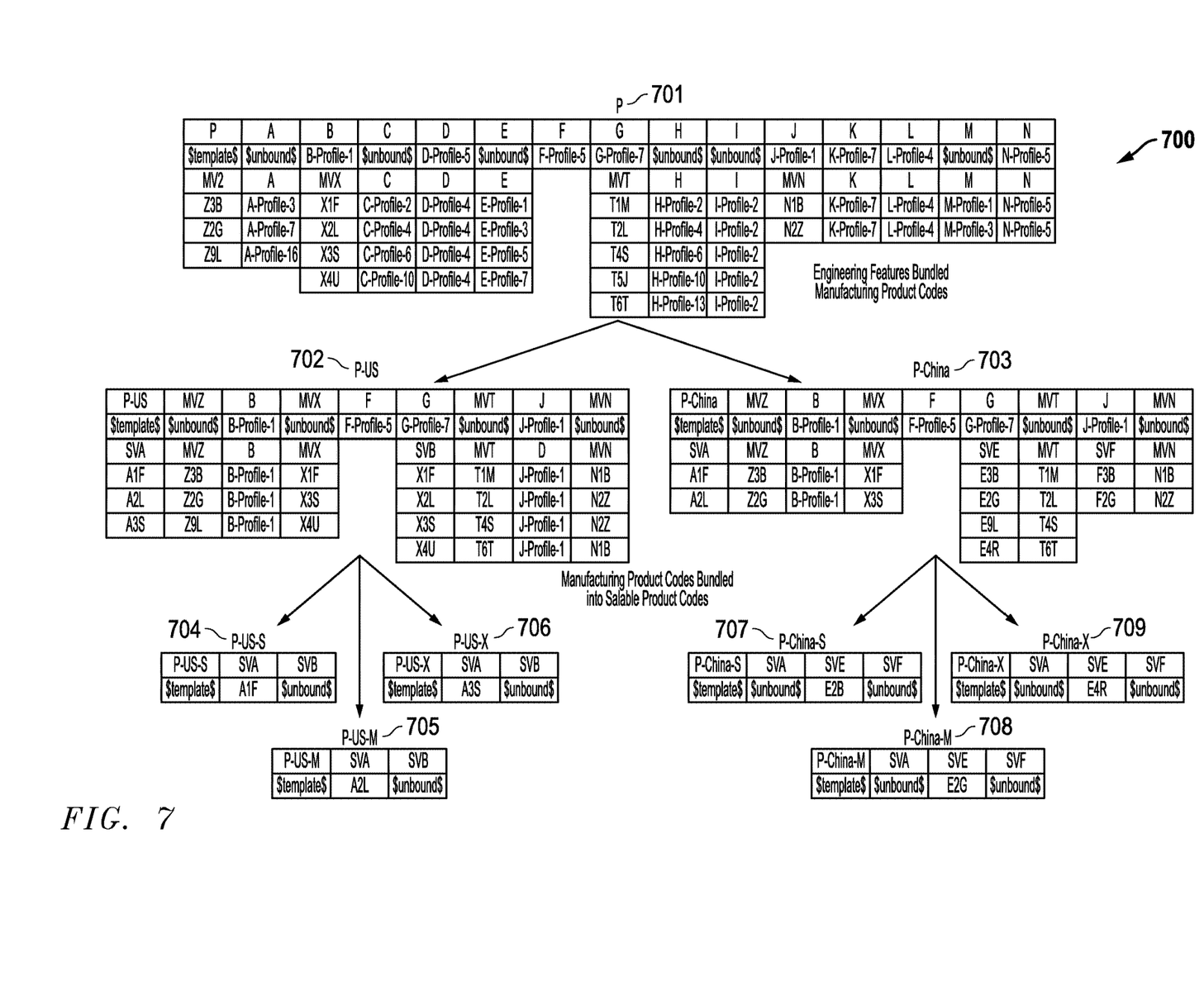
FIG. 7 is a three level multistage configuration tree with feature bundles applied.

FIG. 7 shows 3-level multistage configuration tree 700 with feature bundles applied. It is an example of how feature bundles might be used in practice by a product line engineering organization. In this example The root node in the tree, node P 701, represents the feature configurations offered by the product engineering team. The feature combinatorics are too large for the manufacturing team to deal with, so feature bundles are applied to create a smaller collection of manufacturable configurations.

The second-level nodes in the tree, node P-US 702 and node P-China 703, represent the manufacturable products for the US and the China markets, respectively. The feature combinations are too large for the US and China Sales team to deal with, so feature bundles are applied to create a smaller collection of salable configurations.

The third-level nodes in the tree, P-US-S 704, P-US-M 705, P-US-X 706, P-China-S 707, P-China-M 708, and P-China-X 709, represent the salable product configurations for the standard (S), midrange (M) and premium (X) tiers of both the US and China markets. The unbound features at this level are proliferated to create all possible salable feature configurations for the product family.

Figure 8:
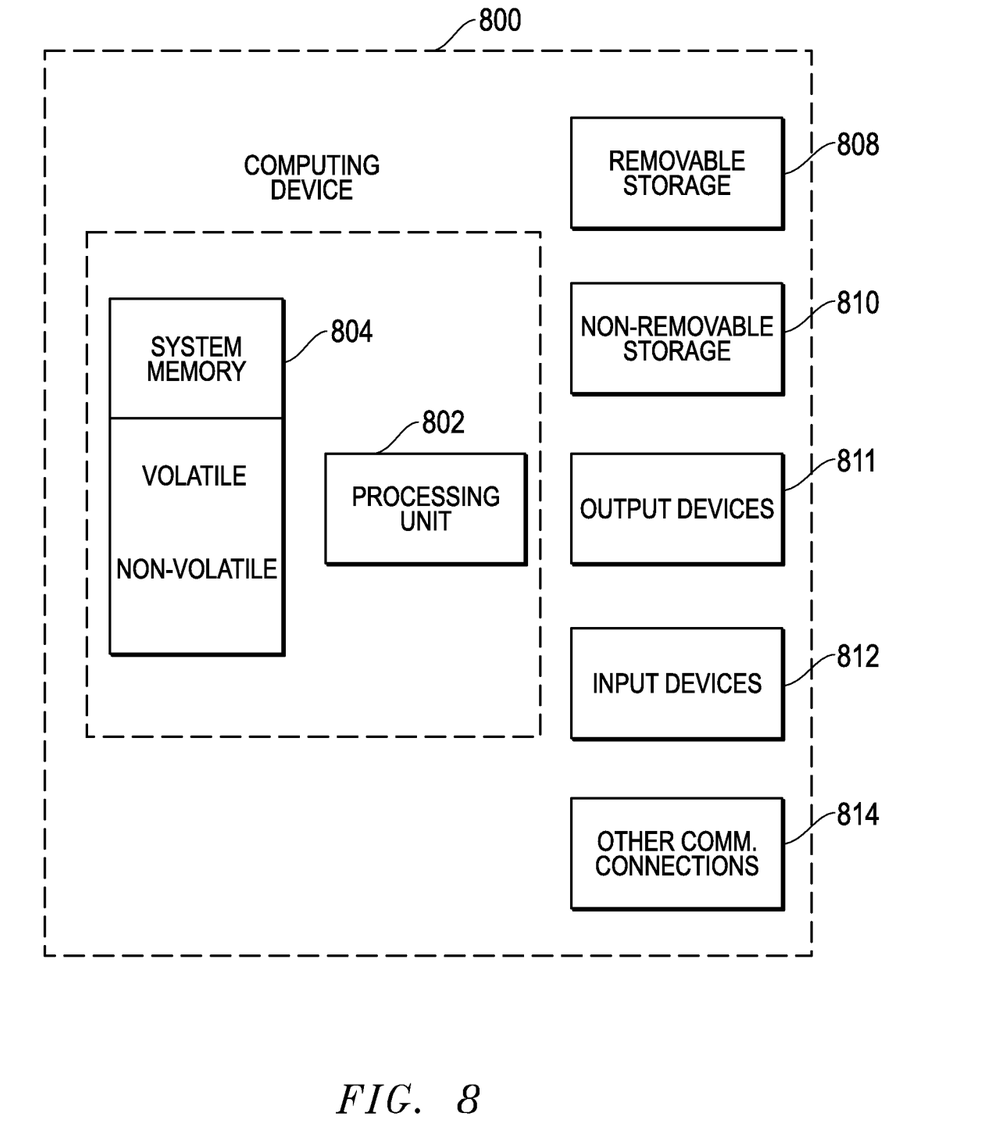
FIG. 8 is a diagram showing one embodiment of a computing device used for automating the creation of product option codes configured in accordance with an embodiment of the present invention.

Referring now to FIG. 8 which shows a first embodiment of a computing device 800, such as, for example, a server, used to implement one or more parts of the creation of software representations of feature bundles in accordance with an embodiment of the present invention. In its most basic configuration, the computing device 800 includes at least one processing unit 802 and memory 804. Depending on the exact configuration and type of computing device, memory 804 may be volatile, such as RAM, non-volatile, such as ROM, flash memory, etc., or some combination of the two. This most basic configuration is illustrated in FIG. 8 by dashed line 806. Computing device 800 can be configured to create software representations of feature bundles in accordance with an embodiment of the present invention.

Computing device 800 may optionally include additional features. For example, device 800 may also include additional removable and/or non-removable storage including, but not limited to, magnetic or optical disks or tape. Such additional storage is illustrated in FIG. 8 by removable storage 808 and non-removable storage 810. Computer storage media includes volatile and nonvolatile, removable and non-removable media implemented in any method or technology for storage of information such as computer readable instructions, data structures, program modules or other data. Memory 804, removable storage 808 and non-removable storage 810 are all examples of computer storage media. Computer storage media includes, but is not limited to, RAM, ROM, EEPROM, flash memory or other memory technology, CD-ROM, magnetic disk storage or other magnetic storage devices, or any other medium which can be used to store the desired information and which can accessed by computing device 800.

Computing device 800 may include one or more communication connections 814 for communication with other computers and/or other applications 815. Computing device 800 may also have input device(s) 812 such as keyboard, mouse, pen, voice input device, touch input device, etc. Output device(s) 811 such as a printer, may also be included.

Figure 9:
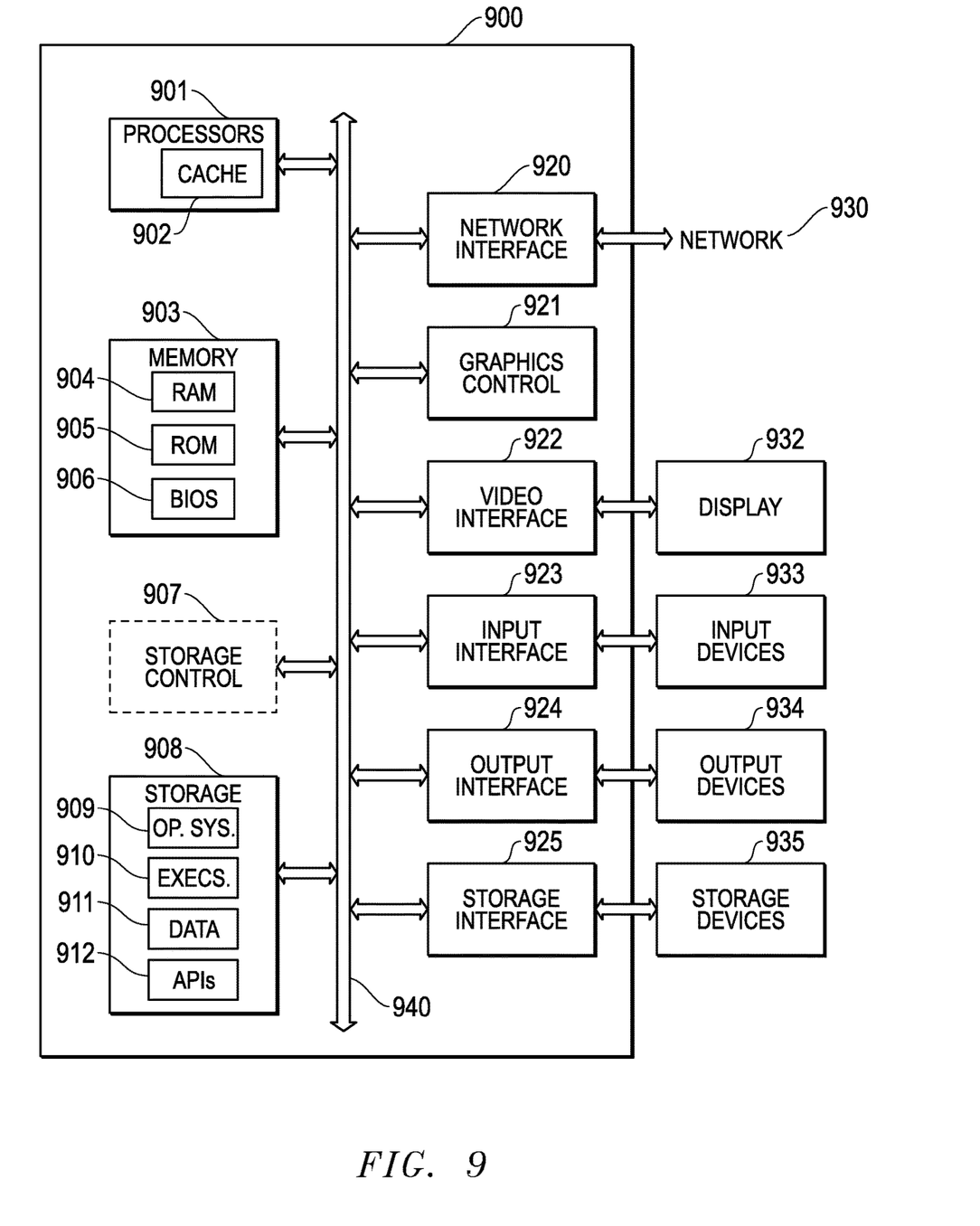
FIG. 9 is a diagram showing another embodiment of a computing device used for automating the creation of product option codes configured in accordance with an embodiment of the present invention.

Systems and methods in accordance with embodiments of the inventive subject matter can be implemented in any number of different types of computing device. For example, FIG. 9 shows a diagrammatic representation of a second embodiment of a computing device 900 within which a set of instructions can cause a device to perform or execute any one or more of the aspects and/or methodologies of the present disclosure. The components in FIG. 9 are examples only and do not limit the scope of use or functionality of any hardware, software, embedded logic component, or a combination of two or more such components implementing particular embodiments.

The computing device 900 can include a processor 901, memory 903 and storage 908 that communicate with each other, and with other components, via a bus 940. The bus 940 can also link a display 932, one or more input devices 933, one or more output devices 934, one or more storage devices 935. All of these elements can interface directly or via one or more interfaces or adaptors to the bus 940. For instance, the storage devices 935 can interface with the bus 940 via storage medium interface 926. All or a portion of the elements 901-936 can be housed in a single unit.

Processor(s) 901 are configured to assist in execution of computer readable instructions, in this case for the creation of software representations of feature bundles in accordance with embodiments of the present invention. Computing device 900 can provide functionality as a result of the processor(s) 901 executing software embodied in one or more tangible computer-readable storage media, such as memory 903, storage 908 and/or storage devices 935. The computer-readable media can store software that implements particular embodiments of the inventive subject matter, and processor(s) 901 can execute the software. Memory 903 can read the software from one or more other computer-readable media or from one or more other sources through a suitable interface, such as network interface 920. The software can cause processor(s) 901 to carry out one or more processes or one or more steps of one or more processes described or illustrated herein. Carrying out such processes or steps can include defining data structures stored in memory 903 and modifying the data structures as directed by the software.

In addition or as an alternative, computing device 900 can provide functionality as a result of logic hardwired or otherwise embodied in a circuit, which can operate in place of or together with software to execute one or more processes or one or more steps of one or more processes described or illustrated herein. The present disclosure encompasses any suitable combination of hardware, software, or both.

For clarity, the various illustrative logical blocks, modules, circuits, and algorithm steps described in connection with the embodiments disclosed herein can be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans can implement the described functionality in varying ways for each particular application, but such implementation decisions should not be interpreted as causing a departure from the scope of the inventive subject matter.

The various illustrative logical blocks, modules, and circuits described in connection with the embodiments disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein.

While the present system and method has been disclosed according to the preferred embodiment of the invention, those of ordinary skill in the art will understand that other embodiments have also been enabled. Even though the foregoing discussion has focused on particular embodiments, it is understood that other configurations are contemplated. In particular, even though the expressions "in one embodiment" or "in another embodiment" are used herein, these phrases are meant to generally reference embodiment possibilities and are not intended to limit the invention to those particular embodiment configurations. These terms may reference the same or different embodiments, and unless indicated otherwise, are combinable into aggregate embodiments. The terms "a", "an" and "the" mean "one or more" unless expressly specified otherwise. The term "connected" means "communicatively connected" unless otherwise defined.

When a single embodiment is described herein, it will be readily apparent that more than one embodiment may be used in place of a single embodiment. Similarly, where more than one embodiment is described herein, it will be readily apparent that a single embodiment may be substituted for that one device.

In light of the wide variety of methods for the extension of feature bundles in multistage configuration trees known in the art, the detailed embodiments are intended to be illustrative only and should not be taken as limiting the scope of the invention. Rather, what is claimed as the invention is all such modifications as may come within the spirit and scope of the following claims and equivalents thereto.

None of the description in this specification should be read as implying that any particular element, step or function is an essential element which must be included in the claim scope. The scope of the patented subject matter is defined only by the allowed claims and their equivalents. Unless explicitly recited, other aspects of the present invention as described in this specification do not limit the scope of the claims.

What is claimed is:

1. A product line management system comprising:
    a product family tree computer data structure, wherein each node defines a subfamily and each parent node of the product family tree has one or more feature profiles; wherein at least one of the one or more feature profiles are partially bound feature profiles having some feature decisions that have been made and some feature decisions that have not been made;
    one or more feature profiles within the parent node are collected into a view, wherein only a limited combination of feature decisions in the parent node are explicitly included in the view, thereby creating a feature bundle; and
    one or more child nodes in the product family tree, wherein the one or more child nodes must inherit, must honor, and may not override feature decisions in the feature bundle, regardless of the feature decisions available at the parent node; and
    wherein creation and modification of the product family tree computer data structure is performed using at least one computing device.

2. The product line management system of claim 1, wherein a feature decision at a parent node in the product family tree is propagated by a computer algorithm on the computing device to the child node.

3. A method comprising:
    receiving a selection or downselection decision at a profile on a node of a product family tree, wherein each node defines a subfamily and each parent node of the product family tree has one or more feature profiles, at least one of which is a partially bound feature profile having some feature decisions that have been made and some feature decisions that have not been made;
    collecting one or more feature profiles within the parent node into a view, wherein only a limited combination of feature decisions in the parent node are explicitly included in the view, thereby creating a feature bundle;
    downselecting the feature bundle to the child node, thereby constraining the space of available choices by excluding some decisions from further consideration, wherein the creation and modification of the product family tree computer data structure is performed with at least one computing device.

4. The method of claim 3, wherein the node is an internal node of the product family tree.

5. The method of claim 3, wherein the node is a leaf node of the product family tree.

6. The method of claim 3, wherein a decision at an internal node in the product tree will stop propagating changes from the internal node's parent to the children of the internal node and will instead propagate the decision to the children of the internal node.

* * * * *